United States Patent
Kuramoto

(10) Patent No.: US 11,777,277 B2
(45) Date of Patent: Oct. 3, 2023

(54) SEMICONDUCTOR LASER

(71) Applicant: Mitsubishi Electric Corporation, Tokyo (JP)

(72) Inventor: Kyosuke Kuramoto, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 467 days.

(21) Appl. No.: 17/257,662

(22) PCT Filed: Sep. 12, 2018

(86) PCT No.: PCT/JP2018/033763
§ 371 (c)(1),
(2) Date: Jan. 4, 2021

(87) PCT Pub. No.: WO2020/053980
PCT Pub. Date: Mar. 19, 2020

(65) Prior Publication Data
US 2021/0273410 A1 Sep. 2, 2021

(51) Int. Cl.
*H01S 5/16* (2006.01)
*H01S 5/042* (2006.01)
*H01S 5/32* (2006.01)
*H01S 5/323* (2006.01)

(52) U.S. Cl.
CPC .......... *H01S 5/166* (2013.01); *H01S 5/04256* (2019.08); *H01S 5/3211* (2013.01); *H01S 5/32391* (2013.01)

(58) Field of Classification Search
CPC ................................................ H01S 5/16–168
See application file for complete search history.

(56) References Cited

U.S. PATENT DOCUMENTS

| 2017/0012410 A1 | 1/2017 | Hagimoto et al. |
| 2019/0131770 A1 | 5/2019 | Ikedo et al. |

(Continued)

FOREIGN PATENT DOCUMENTS

| JP | H05-218593 A | 8/1993 | |
| JP | 10290043 | * 10/1998 | ............... H01S 5/18 |
| JP | 2002-164617 A | 6/2002 | |

(Continued)

OTHER PUBLICATIONS

International Search Report issued in PCT/JP2018/033763; dated Dec. 11, 2018.

*Primary Examiner* — Xinning(Tom) Niu
*Assistant Examiner* — Delma R Fordé
(74) *Attorney, Agent, or Firm* — Studebaker & Brackett PC

(57) ABSTRACT

A semiconductor laser comprises a window structure part including a low resistance active layer formed in end face regions, to have a lower resistance than an active layer located inward with respect to the end face regions. A length between the front end of the contact layer and the front end face is longer by 10 μm or more than a length of a front-end-face side window structure part, and is shorter than a length between the front end face and the rear end of the contact layer. A length between an end of a rear side electrode on the side of the front end face and the front end face is 1.2 times or more a substrate thickness of a substrate, and is shorter than a length between the front end face and an end of the rear side electrode on the side of the rear end face.

19 Claims, 8 Drawing Sheets

(56) References Cited

U.S. PATENT DOCUMENTS

2020/0083671 A1    3/2020  Sakaino et al.
2022/0013987 A1*   1/2022  Yamada ................... H01S 5/162

FOREIGN PATENT DOCUMENTS

| JP | 2006108225   | * | 4/2006  | ............... H01S 5/16  |
| JP | 2010278131   | * | 12/2010 | ............. H01S 5/223 |
| JP | 2013-143550 A |  | 7/2013  | |
| JP | 6210186 B1   |   | 10/2017 | |
| WO | 2018/003335 A1 | | 1/2018  | |
| WO | 2018/105015 A1 | | 6/2018  | |

* cited by examiner

SEMICONDUCTOR LASER

TECHNICAL FIELD

The present application relates to a semiconductor laser.

BACKGROUND ART

A light source using a semiconductor laser has advantages such as small size, good color reproducibility, low power consumption, and high brightness compared with other light sources, and is used as a light source for projectors and projection type displays for cinemas, etc. The lifetime of the semiconductor laser is determined mainly by a degradation called Catastrophic Optical mirror Damage (COD) degradation (optical damage of end face) and a degradation called Slow degradation (gradual degradation). Among these two types of degradation, the causes of COD degradation are as follows.

At a laser end face, an interface state exists in the energy region of the original band gap due to the existence of dangling bonds, etc. The band gap of the active layer in the vicinity of the end face is smaller than that of the other part because the band gap is bent in such a manner as if being dragged by the end face. This means that the absorption of the laser light is increased, and the temperature near the laser end face is increased by the absorption of the laser light. The increase in temperature near the laser end face further reduces the band gap, leading to a positive feedback process in which the absorption of laser light is further increased, and finally the laser end face is melted.

In order to alleviate such a problem, a structure called a window structure is often employed in a semiconductor laser, for example, as disclosed in Patent Document 1. This window structure is one of the methods for enlarging the band gap in the vicinity of the laser end face, and suppresses the absorption at the laser end face, thereby making it difficult to cause COD degradation. Note here that, in the case of a red semiconductor laser, there is a well-known method in which an impurity such as zinc (Zn) is diffused to the laser end face to mix atoms in the vicinity of the active layer of the laser, thereby enlarging the band gap.

The light absorption at the laser end face is greatly related to the occurrence of COD degradation. However, in the semiconductor laser provided with a window structure part in which the window structure is formed, since the resistance of the window structure part becomes small owing to the diffusion of Zn or the like, the temperature of the laser end face may rise owing to heat generation caused by the current flowing through the window structure part, and the band gap may become small. In particular, in the case where the window structure part is formed by impurity diffusion, since an impurity of about $1 \times 10^{18}$ cm$^{-3}$ or more exists in the window structure part and the band gap of the active layer becomes small by the impurity diffusion, the forward voltage of the window structure part becomes smaller than that of the other part, so that the current flowing through the window structure part becomes large. Due to Joule heat caused by the current and the non-light emitting recombination via the impurity level, heat generation in the window structure part increases, and COD degradation tends to occur.

As a method of suppressing heat generation due to the current flowing in the vicinity of the laser end face that causes COD degradation, Patent Document 2 discloses that a current non-injection region is formed in such a way that a p-electrode being a front side electrode and a contact layer that are on the front side of a semiconductor substrate and formed as upper layers than the active layer are apart from the laser end face. In the semiconductor laser disclosed in Patent Document 2, an SiO$_2$ film (insulating film) is formed on a surface of a cladding layer from which the front side electrode and the contact layer on the laser end face side is removed.

CITATION LIST

Patent Document

Patent Document 1: Japanese Patent Application Laid-open No. H05-218593 (FIG. 3)
Patent Document 2: Japanese Patent Application Laid-open No. 2002-164617 (paragraphs [0013], [0024], FIG. 1)

SUMMARY OF INVENTION

Problems to be Solved by Invention

Although the semiconductor laser in Patent Document 2 has a structure in which the window structure part is not included, it is designed to suppress the occurrence of COD degradation by reducing the current at the laser end face. Here, in a semiconductor laser provided with a window structure part using impurity diffusion, the following case is considered. The front side electrode and the contact layer are apart from the laser end face, and the insulating film is formed on the surface of the cladding layer from which the front side electrode and the contact layer on the laser end face side are removed. A length between the laser end face and a point closest to the laser end face in the region where the p-electrode is in contact with the contact layer is referred to as a setback amount of the front side electrode, and a region where the insulating film is formed on the surface of the cladding layer from which the front side electrode and the contact layer on the laser end face side are removed is referred to as a contact layer non-forming region.

In the semiconductor laser provided with the window structure part using the impurity diffusion in Patent Document 1, by making the width of the window structure part from the laser end face smaller than the setback amount of the front side electrode, the current flowing in the vicinity of the laser end face can be suppressed. In addition to the above, since the current of the entire region covered with the insulating film is suppressed in the vicinity of the laser end face, a part having a current density lower than that of the other laser oscillation region is generated in the laser oscillation region that is not in the window structure part. This is because, although the current density in the active layer increases in the region where the window structure part and the contact layer are formed, the current injection amount decreases in the contact layer non-forming region in the laser oscillation region, thereby decreasing the current density in the active layer. Since the gain of the active layer medium in the part where the current density is low is smaller than that in the other part where the current density is high, problems such as deterioration of temperature characteristics due to carrier overflow caused by an increase in the oscillation threshold or an increase in the threshold carrier density arise. In some cases, the gain is equal to or less than zero, namely, the part becomes a light absorption region, causing a significant deterioration in the characteristics and reduction in slope efficiency.

The technology disclosed in the present application is aimed at obtaining a semiconductor laser provided with a window structure part in which COD tolerance is improved on at least one of the laser end face sides while characteristic deterioration is suppressed.

Means for Solving Problems

An example of a semiconductor laser disclosed in the specification of the present application is a semiconductor laser for outputting laser light incudes: a semiconductor substrate; an active layer formed on a front side of the semiconductor substrate via a first cladding layer; a front side electrode formed on a front side of the active layer that is an opposite side to a side facing the semiconductor substrate, via a second cladding layer and a contact layer; a rear side electrode formed on a rear side of the semiconductor substrate. The semiconductor laser incudes a window structure part including a low resistance active layer that is formed in end face regions on a side of a front end face and on a side of a rear end face between which the laser light travels back and forth and resonates, to have a lower resistance than the active layer located inward with respect to the end face regions. A front end of the contact layer is defined as an end of the contact layer on the side of the front end face, a rear end of the contact layer is defined as an end of the contact layer on the side of the rear end face. A length in a light round-trip direction in which the laser light travels back and forth between the front end of the contact layer on the side of the front end face where the laser light is outputted and the front end face is longer by 10 μm or more than a length of a front-end-face side window structure part that is a length in the light round-trip direction between a boundary of the window structure part on the side of the front end face and the front end face, and is shorter than a length in the light round-trip direction between the front end face and the rear end of the contact layer. A length in the light round-trip direction between an end of the rear side electrode on the side of the front end face and the front end face is 1.2 times or more a substrate thickness of the semiconductor substrate, and is shorter than a length in the light round-trip direction between the front end face and an end of the rear side electrode on the side of the rear end face.

Effect of Invention

In an example of the semiconductor laser disclosed in the present application, since the length between the front end of the contact layer and the front end face in the light round-trip direction in which the laser light travels back and forth is longer than the length of the front-end-face side window structure part by 10 μm or more, and the length in the light round-trip direction between the end of the rear side electrode on the side of the front end face and the front end face is 1.2 times or more the substrate thickness of the semiconductor substrate, the COD tolerance of the window structure part on the side of the front end face can be improved while deterioration of the characteristics is suppressed.

MODES FOR CARRYING OUT INVENTION

Embodiment 1

Figure 1:
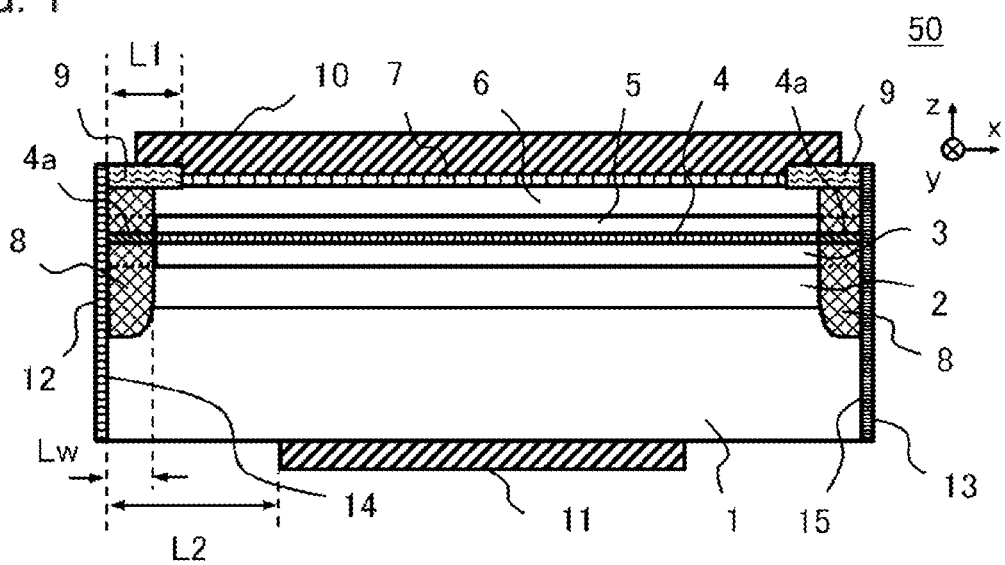
FIG. 1 shows a cross-sectional structure of a semiconductor laser according to Embodiment 1.
Figure 2:
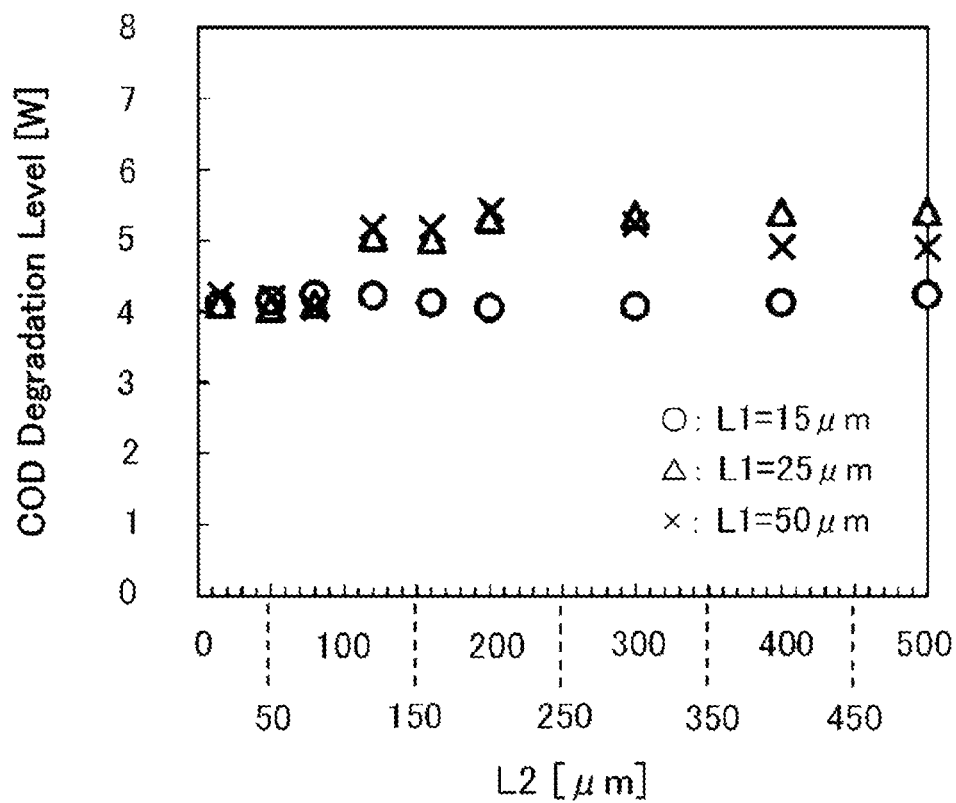
FIG. 2 shows a COD degradation level of the semiconductor laser of FIG. 1.
Figure 3:
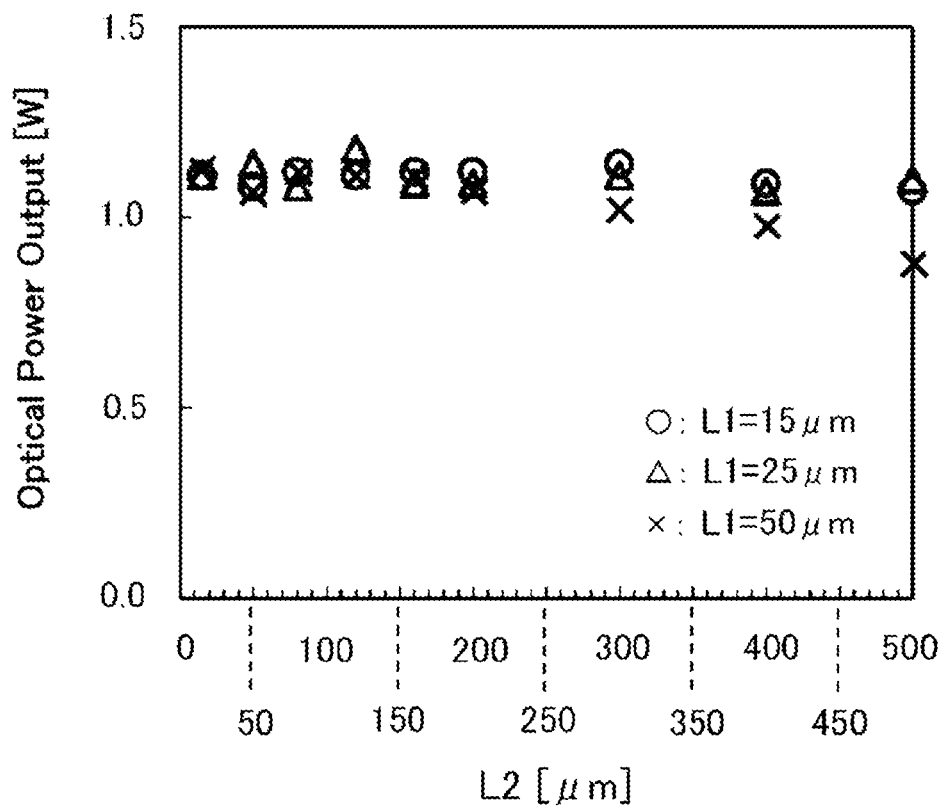
FIG. 3 shows an optical power output of the semiconductor laser of FIG. 1.
Figure 4:
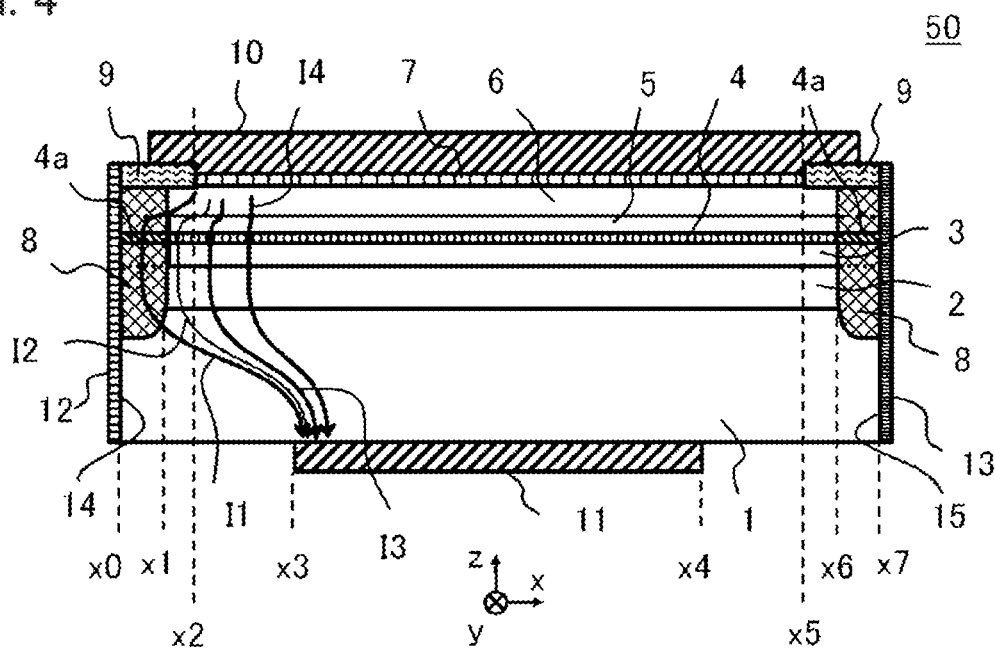
FIG. 4 shows current in the semiconductor laser of FIG. 1.
Figure 5:
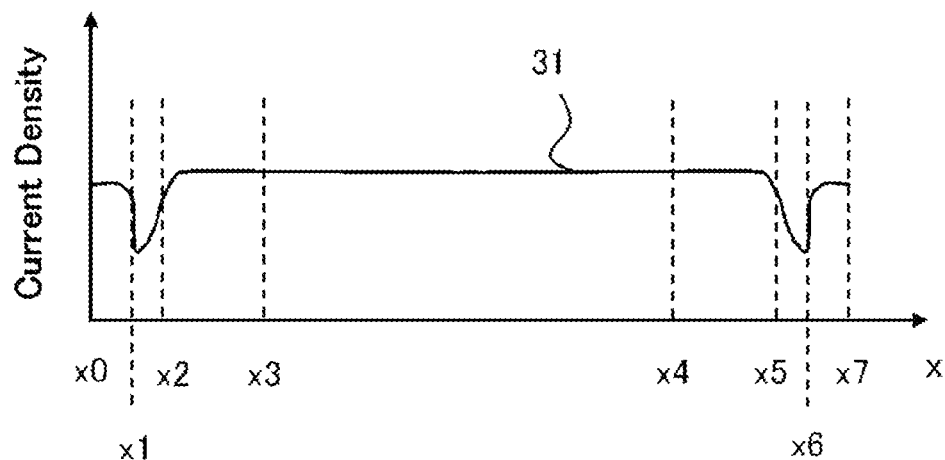
FIG. 5 shows current density of the semiconductor laser of FIG. 1.

FIG. 1 shows a cross-sectional structure of a semiconductor laser according to Embodiment 1. FIG. 2 shows a COD degradation level of the semiconductor laser of FIG. 1, and FIG. 3 shows an optical power output of the semiconductor laser of FIG. 1. FIG. 4 shows current in the semiconductor laser of FIG. 1, and FIG. 5 shows current density of the semiconductor laser of FIG. 1. The semiconductor laser 50 of Embodiment 1 has a resonator structure in which laser light resonates by traveling back and forth between a front end face 14 and a rear end face 15. FIG. 1 shows the cross-sectional structure in a resonator direction (x-direction) being a direction in which the laser light of the semiconductor laser 50 of Embodiment 1 travels back and forth, and in a direction (z-direction) perpendicular to the resonator direction. The semiconductor laser 50 has an n-type GaAs semiconductor substrate 1, and a first cladding layer 2 made of n-type AlInP is formed on a surface of the semiconductor substrate 1 so as to be directly bonded to the semiconductor substrate 1. A first optical guide layer 3 made of undoped AlInP is formed on the surface of the first cladding layer 2 (surface opposite to the surface facing the semiconductor substrate 1), and an active layer 4 made of undoped GaInP is formed on the surface of the first optical guide layer 3. A second optical guide layer 5 made of undoped AlGaInP is formed on the surface of the active layer 4, a second cladding layer 6 made of p-type AlInP is formed on the surface of the second optical guide layer 5, and a contact layer 7 made of p-type GaAs is formed on the surface of the second cladding layer 6. The first cladding layer 2, the first optical guide layer 3, the second optical guide layer 5, and the second cladding layer 6 are each made of an AlGaInP-based material.

The thickness (substrate thickness) of the semiconductor substrate 1 is 100 μm, for example. The first cladding layer 2 has a thickness of about 1.0 μm and its carrier concentration is about $1.0 \times 10^{18}$ cm$^{-3}$. The thickness of the first optical guide layer 3 and the second optical guide layer 5 is about 0.1 μm, and the thickness of the active layer 4 is about 8-20 nm. The thickness of the second cladding layer 6 is about 1.0 µm, and its carrier concentration is about $1.0 \times 10^{18}$ cm$^{-3}$. The thickness of the contact layer 7 is about 0.02 µm, and its carrier concentration is about $(1.0\text{-}2.0) \times 10^{19}$ cm$^{-3}$.

In a region inward from the front end face 14 and a region inward from the rear end face 15, a window structure part 8 in which band gap is enlarged by diffusion of Zn is formed. The direction from the front end face 14 to the rear end face 15 is the x-direction, the direction from the semiconductor substrate 1 to the active layer 4 is the z-direction, and the direction perpendicular to the x-direction and the z-direction is the y-direction. A window structure part length Lw of the window structure part 8 in the direction in which light travels back and forth (x-direction) is 15 µm. The direction in which the light travels back and forth is also referred to as the light round-trip direction as required. An SiN insulating film 9 for not injecting current is formed on the surfaces of the window structure part 8 and the second cladding layer 6 on the side of the window structure part 8, and a front side electrode 10 is formed on the surface of the insulating film 9 and the surface of the contact layer 7. A rear side electrode 11 is formed on the rear surface of the semiconductor substrate 1. Of the front end face 14 and the rear end face 15 that are cleaved end faces of the semiconductor laser 50, on the side of the front end face 14 from which laser light is taken out (laser light is output), a coating film 12 with low reflectivity formed of a single or multilayer film of a dielectric is applied. Further, on the side of the rear end face 15 of the semiconductor laser 50, a coating film 13 with high reflectivity formed of a dielectric multilayer film is formed. Note that, the insulating film 9 is formed up to end portions of a light emitting stripe such as a mesa stripe in the direction perpendicular to the paper plane in FIG. 1 (y-direction) that is the direction perpendicular to the light round-trip direction (x-direction).

The first cladding layer 2, the first optical guide layer 3, the active layer 4, the second optical guide layer 5, the second cladding layer 6, and the contact layer 7 are sequentially laminated. The processes of forming the first cladding layer 2, the first optical guide layer 3, the active layer 4, the second optical guide layer 5, the second cladding layer 6, and the contact layer 7 are respectively a first cladding layer forming process, a first optical guide forming process, an active layer forming process, a second optical guide forming process, a second cladding layer forming process, and a contact layer forming process. After the contact layer forming process, in a window structure part forming process described later, the window structure part 8 is formed in regions on the side of the front end face 14 and on the side of the rear end face 15 of the semiconductor laser 50. After the window structure part forming process, the insulating film 9 is formed in an insulating film forming process. After the insulating film forming process, the front side electrode 10 is formed in a front side electrode forming process, and the rear side electrode 11 is formed in a rear side electrode forming process. After the front side electrode forming process and the rear side electrode forming process, the semiconductor laser 50 is individually separated, and an end face coating process in which the coating films 12 and 13 are formed is performed on the front end face 14 and the rear end face 15 that are the cleaved end faces.

In the front side electrode 10, the length (length in x-direction) in the light round-trip direction on the side opposite to the side in contact with the contact layer 7, namely, on the outward surface side (front surface side of the semiconductor laser 50) is longer than the length in the light round-trip direction on the side in contact with the contact layer 7, namely, on the inward surface side. The length from the front end face 14 to an inner end of the insulating film 9 and the length from the rear end face 15 to an inner end of the insulating film 9 are both L1. Although L1 is shown only on the side of the front end face 14 in FIG. 1, the length L1 from the rear end face 15 to the inner end of the insulating film 9 on the side of the rear end face 15 is omitted. The length L1 is equal to the length from an end of the front side electrode 10 that is on the side in contact with the contact layer 7, namely, on the inward surface side and on one side of the laser end faces (front end face 14 or rear end face 15) of the semiconductor laser 50, to an end of the one side of the laser end faces (front end face 14 or rear end face 15. The length L1 is the length in the light round-trip direction in a region on the side of the front end face 14 or the rear end face 15 where the front side electrode 10 does not in contact with second cladding layer 6 via the contact layer 7, and is also the length (setback amount of front side electrode) from the front end face 14 or the rear end face 15 to a position inwardly set back. The length L1 is appropriately referred to as a setback amount L1 of the front side electrode. If an end of the contact layer 7 on the side of the front end face 14 is defined as a front end of the contact layer and an end of the contact layer 7 on the side of the rear end face 15 is defined as a rear end of the contact layer, the length L1 is also the length in the light round-trip direction in which the laser light travels back and forth between the front end of the contact layer and the front end face 14 or the length in the light round-trip direction between the rear end of the contact layer and the rear end face 15. FIG. 1 shows an example in which the setback amount L1 of the front side electrode is 25 µm or more and is longer than the window structure part length Lw by 10 µm or more. Note that, in FIG. 1, the window structure part length Lw and an setback amount L2 of the rear side electrode that will be described later are shown only on the side of the front end face 14, and on the side of the rear end face 15, the window structure part length Lw and the setback amount L2 of the rear side electrode are omitted.

The window structure part forming process of forming the window structure part 8 will be described. First, a Zn anti-diffusion film for preventing diffusion of Zn is formed on the entire surface of a wafer in which the first cladding layer 2, the first optical guide layer 3, the active layer 4, the second optical guide layer 5, and the second cladding layer 6 are sequentially formed. The Zn anti-diffusion film on an end face region in which the window structure part 8 is to be formed is removed by etching, and the contact layer 7 on the end face region in which the window structure part 8 is to be formed is removed by etching using the Zn anti-diffusion film as a mask. An insulating film such as SiO$_2$ or SiN can be used for the Zn anti-diffusion film. Here, the contact layer 7 in the end region in which the window structure part 8 is to be formed is removed, because the diffusion rate of Zn in the contact layer 7 is very low, making it difficult to form the window structure part 8 when the contact layer 7 is present. Then, a ZnO film serving as a diffusion source of Zn is formed on the entire surface of the wafer. Thereafter, by thermal annealing, Zn is diffused at least up to the active layer 4 to make the active layer 4 to be a mixed crystal, thereby forming a window structure part 8 including a window-structure-part active layer 4a being the active layer of the mixed crystal. The window-structure-part active layer 4a is a low resistance active layer containing Zn and having a resistance lower than the active layer 4 that is inward with respect to the end face regions on the sides of the front end face 14 and the rear end face 15. The thermal annealing conditions at this time are, for example, 620° C. for 30 minutes. FIG. 1 shows an example in which the window structure part 8 is also formed in the first cladding layer 2 and the semiconductor substrate 1.

Next, the ZnO film and the Zn anti-diffusion film are all removed by etching, and the window structure part forming process is completed. After the window structure part forming process, the insulating film forming process, the front side electrode forming process, the rear side electrode forming process, and the end face coating process described above are performed.

In the front side electrode forming process, a front side electrode 10 is formed on the surfaces of the contact layer 7 and the insulating film 9, and the contact layer 7 and the front side electrode 10 are joined to each other to have low resistance through the opening of the insulating film 9. The front side electrode 10 is formed by laminating a thin film of Ti, Pt, Au or the like, and the total thickness of the front side electrode 10 is 0.05-1.0 μm.

After that, in the rear side electrode forming process, the rear surface of the GaAs semiconductor substrate 1 is polished to a desired thickness, and the rear side electrode 11 is joined to the polished rear surface, the rear side electrode 11 is etched using ion milling or the like such that the setback amount L2 of the rear side electrode being the length between an end of the rear face electrode 11 and the laser end face is 120 μm or more.

The rear side electrode 11 is formed by laminating a thin film of Ti, Pt, Au or the like, and the total thickness of the rear side electrode 11 is 0.05-1.0 μm. In the end face coating process, each semiconductor laser before separation for which the rear side electrode forming process is completed is cleaved in such a way that the resonator length is 1.5 mm, and then the coating film 12 with the reflectivity of 10% is formed on the front end face 14, and the coating film 13 with the reflectivity of 90% is formed on the rear end face 15.

Next, an effect of the semiconductor laser 50 according to Embodiment 1 will be described. FIG. 2 shows the COD degradation level of the semiconductor laser 50 according to Embodiment 1. The horizontal axis represents the setback amount L2 of the rear side electrode, and the vertical axis represents the COD degradation level [W]. The COD degradation level is an index indicating the COD tolerance, and is defined by an optical power output at the time when COD degradation occurs in a case where current is gradually passed through a semiconductor laser that has a light emission point width of 75 μm and is before a long-term energization of the laser. FIG. 2 shows an example in which the setback amount L1 of the front side electrode is 15 μm, 25 μm, or 50 μm. When the setback amount L1 of the front side electrode is 15 μm, namely, when the window structure part length Lw of the window structure part 8 and the setback amount L1 of the front side electrode are the same, the COD degradation level hardly changes even when the setback amount L2 of the rear side electrode is increased. That is, when the window structure part length Lw of the window structure part 8 is equal to the setback amount L1 of the front side electrode, the COD degradation level is hardly improved. In contrast, when the setback amount L1 of the front side electrode is set to 25 μm or 50 μm, the COD degradation level is increased by setting the setback amount L2 of the rear side electrode to 120 μm or more, and a significant improvement in the COD degradation level is confirmed.

FIG. 3 shows an evaluation result of the optical power output in a case where the laser is operated at 45° C. and with a supply current of 1.5 A when the COD degradation level is measured in FIG. 2. The horizontal axis represents the setback amount L2 of the rear side electrode, and the vertical axis represents the optical power output [W] of the semiconductor laser 50. In any case where the setback amount L1 of the front side electrode is 15 μm, 25 μm, or 50 μm, a large decrease in the optical power output cannot be confirmed, and good results are obtained.

Figure 6:
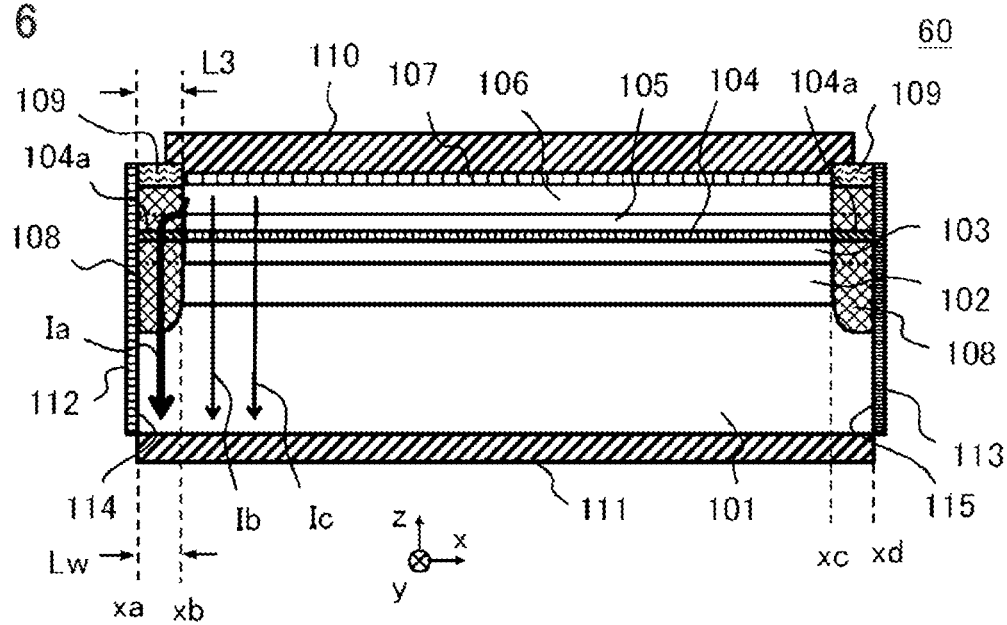
FIG. 6 shows a cross-sectional structure of a semiconductor laser of a comparative example 1.
Figure 7:
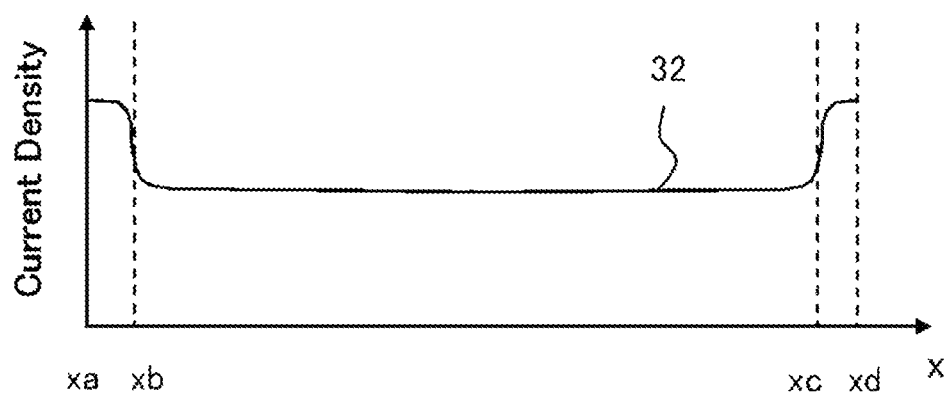
FIG. 7 shows current density of the semiconductor laser of FIG. 6.
Figure 8:
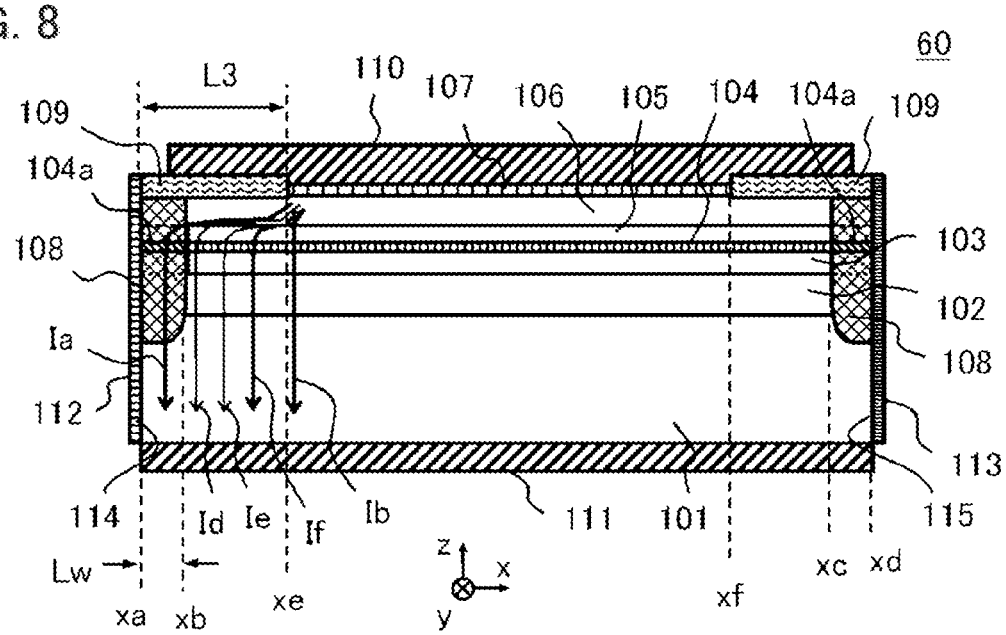
FIG. 8 shows a cross-sectional structure of a semiconductor laser of a comparative example 2.
Figure 9:
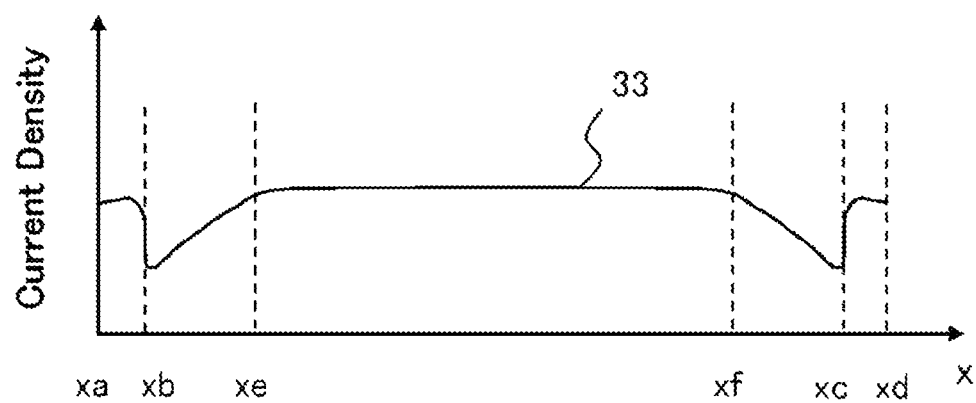
FIG. 9 shows current density of the semiconductor laser of FIG. 8.
Figure 10:
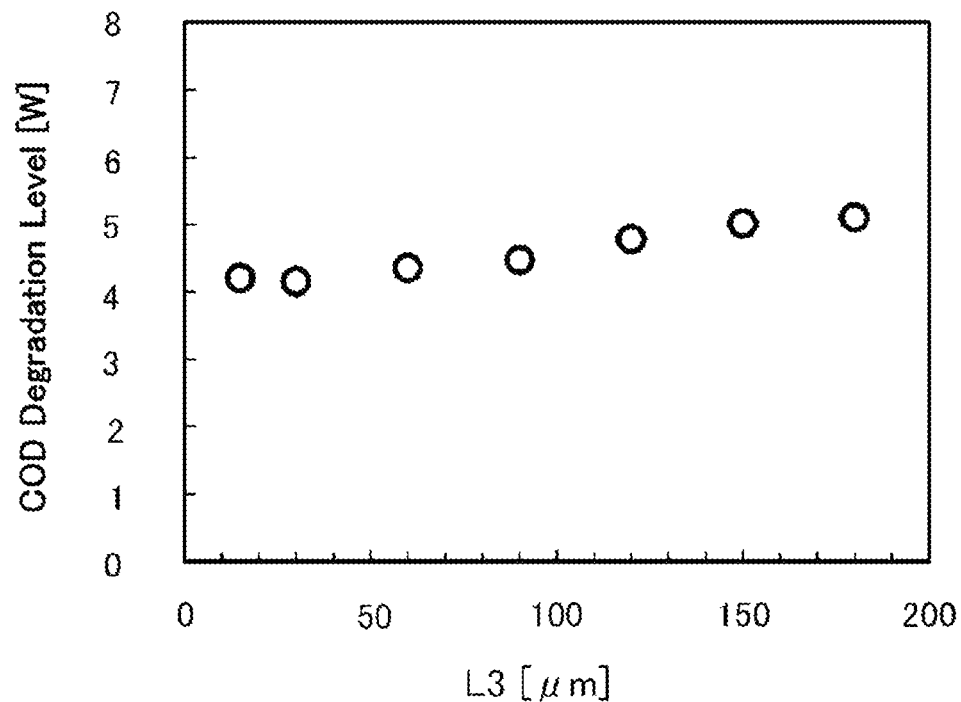
FIG. 10 shows a COD degradation level of the semiconductor laser of FIG. 8.
Figure 11:
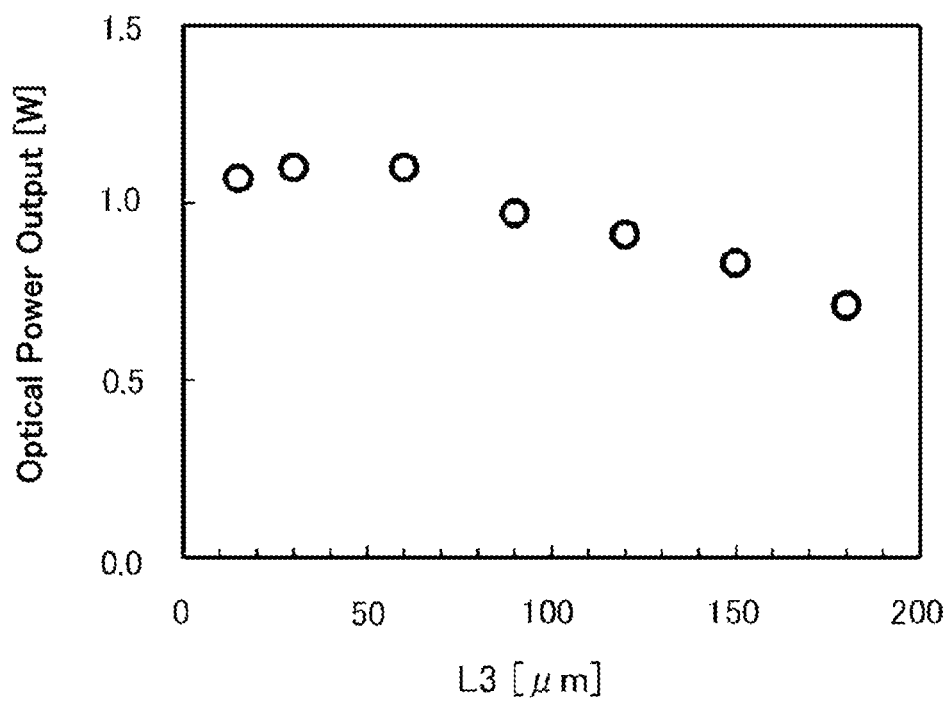
FIG. 11 shows an optical power output of the semiconductor laser of FIG. 8.
Figure 12:
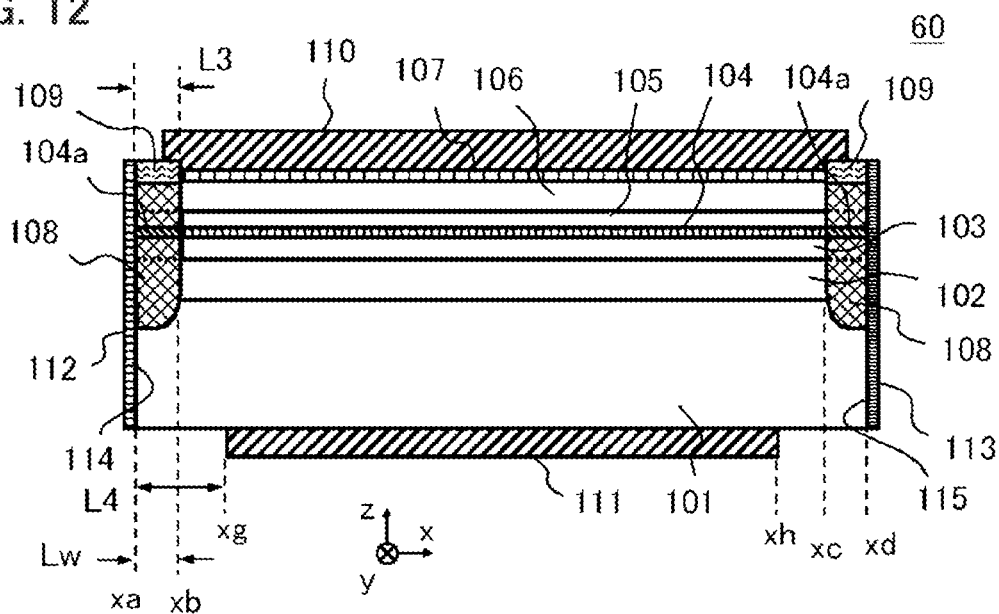
FIG. 12 shows a cross-sectional structure of a semiconductor laser of a comparative example 3.
Figure 13:
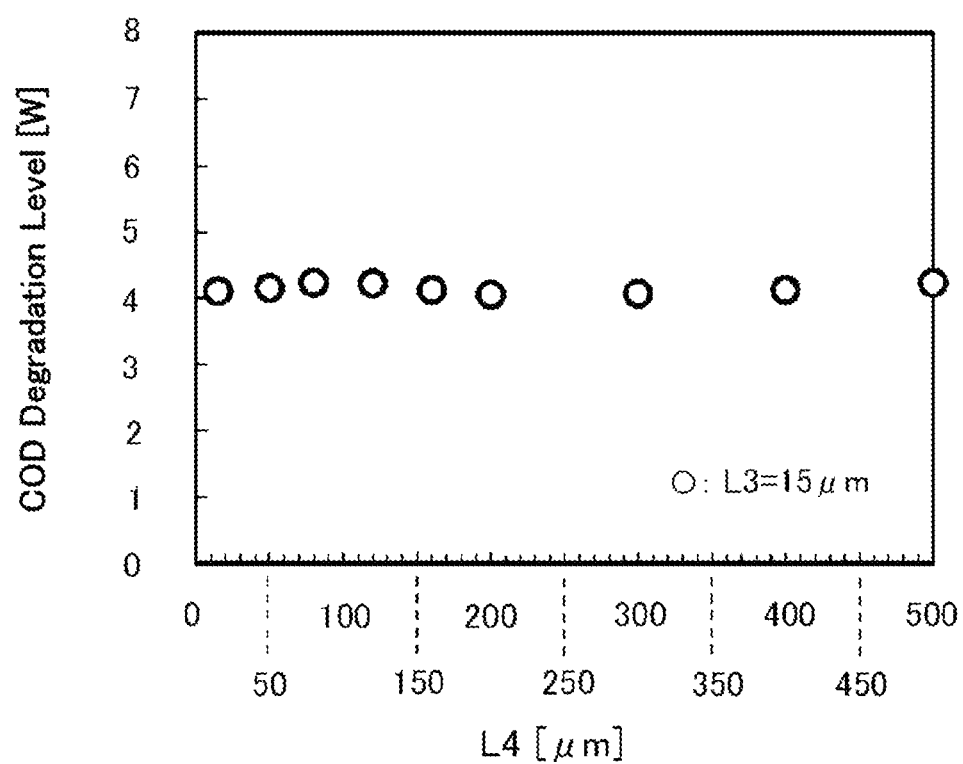
FIG. 13 shows a COD degradation level of the semiconductor laser of FIG. 12.

An effect of the semiconductor laser 50 of Embodiment 1 will be described in comparison with comparative examples. FIG. 6 shows a cross-sectional structure of a semiconductor laser of a comparative example 1, and FIG. 7 shows current density of the semiconductor laser of FIG. 6. FIG. 8 shows a cross-sectional structure of a semiconductor laser of a comparative example 2, and FIG. 9 shows current density of the semiconductor laser of FIG. 8. FIG. 10 shows a COD degradation level of the semiconductor laser of FIG. 8, and FIG. 11 shows an optical power output of the semiconductor laser of FIG. 8. FIG. 12 shows a cross-sectional structure of a semiconductor laser of a comparative example 3, and FIG. 13 shows a COD degradation level of the semiconductor laser of FIG. 12. The semiconductor laser 60 shown in FIGS. 6 and 8 is an example of a red semiconductor laser in which a rear side electrode 111 is formed from a front end face 114 to a rear end face 115. The semiconductor laser 60 shown in FIG. 12 is an example of a red semiconductor laser in which the rear side electrode 111 is formed to be short by the setback amount L4 of the rear side electrode from the front end face 114 and the rear end face 115. FIG. 7 shows the current density at the positions of an active layer 104 in the semiconductor laser 60 of the comparative example 1, and FIG. 9 shows the current density at the positions of the active layer 104 in the semiconductor laser 60 of the comparative example 2.

FIGS. 6, 8, and 12 show cross-sectional structures in the resonator direction (x-direction) and the direction perpendicular thereto (z-direction) of the semiconductor laser 60 in each comparative example. The semiconductor laser 60 of the comparative example 1 shown in FIG. 6 has an n-type GaAs semiconductor substrate 101, an n-type AlInP first cladding layer 102, an undoped AlGaInP first optical guide layer 103, an undoped GaInP active layer 104, an undoped AlGaInP second optical guide layer 105, a p-type AlInP second cladding layer 106, and a p-type GaAs contact layer 107 are sequentially laminated on the surface of the semiconductor substrate 101. The first cladding layer 102, the first optical guide layer 103, the second optical guide layer 105, and the second cladding layer 106 are made of an AlGaInP-based material. In a region inward from the front end face 114 and a region inward from the rear end face 115, a window structure part 108 in which band gap is enlarged by the diffusion of Zn is formed. An SiN insulating film 109 for not injecting current is formed on the surfaces of the window structure part 108, and a front side electrode 110 is formed on the surface of the insulating film 9 109 and the surface of the contact layer 107. A rear side electrode 111 is formed on the rear surface of the semiconductor substrate 101. The direction from the front end face 114 to the rear end face 115 is the x-direction, the direction from the semiconductor substrate 101 to the active layer 104 is the z-direction, and the direction perpendicular to the x-direction and the z-direction is the y-direction.

As for the influence of the diffusion of Zn on the crystal surfaces of the window structure part 108, since the diffusion of Zn is performed, the crystal tends to be rough. Further, an active layer 104a of the window structure part 108 has a lower resistance than the active layer 104, and the window structure part 108 has a lower resistance than the laser oscillation region that is inward with respect to the window structure part 108. The SiN insulating film 109 is formed on the surface of the window structure part 108 so that the front side electrode 110 cannot directly in contact with the window structure part 108. Note that, the insulating film 109 is formed up to end portions of a light emitting stripe such as a mesa stripe in the direction perpendicular to the paper plane (y-direction) in FIG. 6 that is the direction perpendicular to the light round-trip direction (x-direction).

Of the front end face 114 and the rear end face 115 that are cleaved end faces of the semiconductor laser 60, on the side of the front end face 114 from which laser light is taken out (laser light is output), a coating film 112 with low reflectivity formed of a single or multilayer film of a dielectric is applied. Further, on the side of the rear end face 115 of the semiconductor laser 60, a coating film 113 with high reflectivity formed of a dielectric multilayer film is formed. In the semiconductor laser 60 of the comparative example 1, a setback amount L3 of the front side electrode, which is the length in the x-direction from the front end face 114 to an inner end of the insulating film 109 and the length in the x-direction from the rear end face 115 to an inner end of the insulating film 109, is equal to the window structure part length Lw. An x-direction position xa indicates the x-direction position of the front end face 114, and an x-direction position xb indicates the position of the inner ends of the window structure part 108 and the insulating film 109. An x-direction position xd indicates the x-direction position of the front end face 115, and an x-direction position xc indicates the position of the inner ends of the window structure part 108 and the insulating film 109. The window structure part length Lw of the window structure part 108 on the side of the front end face 114 is the length from the x-direction position xa to the x-direction position xb. The window structure part length Lw of the window structure part 108 on the side of the rear end face 115 is the length from the x-direction position xc to the x-direction position xd. Note that, the x-direction positions xb and xc are boundaries between the window structure part 108 and the laser oscillation region that is inward with respect to the window structure part 108 too. In FIG. 6, the setback amount L3 of the front side electrode and the window structure part length Lw are shown only on the side of the front end face 114, and on the side of the rear end face 115, the setback amount L3 of the front side electrode and the window structure part length Lw are omitted.

As shown in FIG. 7, the window structure part 108 that is an x-direction region on the side of the front end face 114 from the x-direction position xa to the x-direction position xb and an x-direction region on the side of the rear end face 115 from the x-direction position xc to the x-direction position xd has a current density in current density characteristics 32 higher than the other region from the x-direction position xb to the x-direction position xc (laser oscillation region being the other region). In FIG. 7, the horizontal axis represents the position in the x direction, and the vertical axis represents the current density. As can be seen from FIG. 7, the window structure part 108 is made to allow current to flow more easily than the other region except for the window structure part 108. Note that, currents Ia, Ib, and Ic shown in FIG. 6 are the currents at each of x-direction positions. In the window structure part 108, the current Ia flowing from the front side electrode 110 to the rear side electrode 111 has a larger current value than the other currents Ib and Ic, and is indicated with a thick arrow.

The semiconductor laser 60 of the comparative example 1 includes the active layer 104a having a low resistance, and the temperature of the laser end face rises and the band gap becomes small due to heat generated by the current flowing through the window structure part 108 having the lower resistance than the laser oscillation region of the inner side. As described in the background art, in the active layer 104a in which Zn has diffused in the active layer 104, that is, in the active layer 104a of the window structure part 108, the band gap becomes smaller than that in the active layer 104 except for the window structure part 108, so that the forward voltage of the window structure part 108 becomes smaller than that of the other region, etc. and then the current (current Ia) flowing to the window structure part 108 becomes large. Due to the Joule heat caused by the current Ia and the non-light emitting recombination via the impurity level, the heat generated in the window structure part 108 is increased, and COD degradation tends to occur.

FIG. 8 shows the semiconductor laser 60 of the comparative example 2 to which one example of methods of suppressing COD degradation is applied. The semiconductor laser 60 of the comparative example 2 shown in FIG. 8 differs from the semiconductor laser 60 of the comparative example 1 in that the width of the window structure part 108 from the laser end face (front end surface 114 or rear end face 115), that is, the window structure part length Lw, is shorter than the setback amount L3 of the front side electrode that is the length of the insulating film 109 in the x-direction. An x-direction position xe indicates the position in the x-direction of the inner end of the insulating film 109 from the front end face 114, and an x-direction position xf indicates the position in the x-direction of the inner end of the insulating film 109 from the rear end face 115. As shown in FIG. 9, in the current density characteristics 33 of the semiconductor laser 60 of the comparative example 2, the current density in the window structure part 108 of the region from the x-direction position xa to the x-direction position xb and the region from the x-direction position xc to the x-direction position xd is lower than that in the current density characteristics 32 of the semiconductor laser 60 of the comparative example 1. From the above, it can be seen that the semiconductor laser 60 of the comparative example 2 can suppress the current flowing closer to the laser end faces of the front end face 114 and the rear end face 115 more than the semiconductor laser 60 of the comparative example 1. In FIG. 9, the horizontal axis represents the position in the x direction, and the vertical axis represents the current density. Note that, currents Ia, Ib, Id, Ie, and If shown in FIG. 8 are the currents at each of x-direction positions. The current Ia flowing from the front side electrode 110 to the rear side electrode 111 in the window structure part 108 and the current Ib flowing from the front side electrode 110 to the rear side electrode 111 inward with respect to the x-direction position xe being the x-direction position of an end of the contact layer 107 have larger current values than the other currents Id, Ie and If, and are indicated by thick arrows. In the currents Id, Ie and If indicated in the region from the x-direction position xb being the x-direction position of the end of the window structure part 108 to the x-direction position xe, the current values have a relation of Id<Ie<If, and are indicated by changing the thickness of the arrow.

In contrast, in the semiconductor laser 60 of the comparative example 2, since the current in the entire region covered by the insulating film 109 in the vicinity of the laser end face is suppressed, in a region from the x-direction position xb to the x-direction position xe and a region from the x-direction position xf to the x-direction position xc in the laser oscillation region that are not in the window structure part 108, a part where the current density being lower than in the laser oscillation region from the x-direction position xe to the x-direction position xf appears. This is because, although the current density in the active layer 104 increases in the region where the window structure part 108 and the contact layer 107 are formed, the amount of current injection from the contact layer 107 decreases in a region that is a contact layer non-forming region of the laser oscillation region located from the x-direction position xb to the x-direction position xe and from the x-direction position xf to the x-direction position xc, so that the current density in the active layer 104 becomes low. Since a gain of an active layer medium in the part where the current density is low is smaller than that in the other part where the current density is high, a problem such as deterioration of temperature characteristics due to carrier overflow caused by an increase in the oscillation threshold or an increase in the threshold carrier density arises. In some cases, the gain is equal to or less than zero, namely, the part becomes a light absorption region, causing a significant deterioration in the characteristics and reduction in slope efficiency.

FIG. 10 shows the COD degradation level of the semiconductor laser 60 of the comparative example 2. The horizontal axis represents the setback amount L3 of the front side electrode and the vertical axis represents the COD degradation level [W]. FIG. 10 shows a case where the window structure part length Lw is 15 μm. FIG. 11 shows an evaluation result of the optical power output of the semiconductor laser 60 of the comparative example 2. The evaluation conditions for the optical power output are the same as those for the semiconductor laser 50 of Embodiment 1. The horizontal axis represents the setback amount L3 of the front side electrode, and the vertical axis represents the optical power output [W] of the semiconductor laser 60. Patent Document 2 describes that the setback amount L3 of the front side electrode is preferably 5 to 50 μm. However, in the embodiment of Patent Document 2, the structure is different from the structure of the semiconductor laser 60 of the comparative example 2 in that, although a current non-injection region corresponding to the contact layer non-forming region is formed, the structure using a GaN material does not have a window structure part. In the semiconductor laser 60 of the comparative example 2, unlike the embodiment of Patent Document 2, it is found that the COD degradation level does not increase, that is, does not improve, unless the setback amount L3 of the front side electrode is 100 μm or more.

It is considered that the reason why the COD degradation level is improved when the setback amount L3 of the front side electrode is 100 μm or more is that the heat generation is suppressed as a result of the current density in the vicinity of the laser end face including the window structure part 108 lowered as shown in FIG. 9. However, as shown in FIG. 11, it can be seen that as the setback amount L3 of the front side electrode increases, the optical power output decreases. It is considered that this is because, as described above, the current density is reduced in the contact layer non-forming region (contact layer non-forming region of laser oscillation region) except for the window structure part 108. Further, in the semiconductor laser 60 of the comparative example 2, since almost all of the current flowing in the contact layer non-forming region is supplied from the end of the contact layer 107, the current is concentrated at the end of the contact layer 107, leading to a problem in that the degradation is likely to occur at the end of the contact layer 107.

As shown in FIGS. 10 and 11, in the semiconductor laser 60 of the comparative example 2, it can be seen that the effect of improving the COD degradation level and the effect of preventing degradation of the optical power output have a perfect trade-off relationship. In the structure in which the resistance of the window structure part 108 formed by the diffusion of Zn or the like becomes small, the current tends to flow in the window structure part 108, and thus it is considered that the improvement effect of the COD degradation level cannot be obtained unless the setback amount L3 of the front side electrode is relatively large, and the problem in the optical power output reduction is likely to occur due to the relatively large setback amount L3 of the front side electrode.

The semiconductor laser 60 of the comparative example 2 is an example of reducing the current density in the vicinity of the laser end face (front end face 114 or rear end face 115) in the semiconductor laser 60 of the comparative example 1, but the problem such as the decrease in the optical power output occurs. Therefore, in order to avoid the problem in the comparative example 2, a method different from that adopted in the comparative example 2 is considered. For example, in Embodiment 1 of U.S. Pat. No. 6,210,186, in the optical semiconductor device in which a semiconductor laser and an optical waveguide are integrated, it is shown that the current density of a laser region in the vicinity of a junction is reduced by reducing a region of an n-electrode by moving an end of the n-electrode corresponding to the rear side electrode typically formed in the laser region and the waveguide region, from the junction between the laser region and the waveguide region to the side to the laser region. The inventor of the present disclosure considers that there is a possibility of reducing the current density in the vicinity of the laser end face by making the rear side electrode 111 apart from the laser end face (front end face 114 or rear end face 115) in the semiconductor laser 60 of the comparative example 1 in the same manner as U.S. Pat. No. 6,210,186.

FIG. 12 shows the cross-sectional structure of the semiconductor laser 60 of the comparative example 3 and FIG. 13 shows the COD degradation level of the semiconductor laser 60 of the comparative example 3. The semiconductor laser 60 of the comparative example 3 differs from the semiconductor laser 60 of the comparative example 1 in that it includes the rear side electrode 111 whose end is moved inwardly from the laser end face (front end surface 114 or rear end surface 115). The x-direction position xg indicates the position in the x-direction of an end of the rear side electrode 111 on the side of the front end face 114, and the x-direction position xh indicates the position in the x-direction of an end of the rear side electrode 111 on the side of the rear end face 115. The length between the end of the rear side electrode 111 and the laser end face (front end surface 114 or rear end face 115) is the setback amount L4 of the rear side electrode. In FIG. 12, the setback amount L3 of the front side electrode, the setback amount L4 of the rear side electrode, and the window structure part length Lw are shown only on the side of the front end face 114, and on the side of the rear end face 115, the setback amount L3 of the front side electrode, the setback amount L4 of the rear side electrode, and the window structure part length Lw are omitted. The length from the x-direction position xa to the x-direction position xg is the setback amount L4 of the rear side electrode, and the length from the x-direction position xh to the x-direction position xd is the setback amount L4 of the rear side electrode.

FIG. 13 shows a relationship between the setback amount L4 of the rear side electrode and the COD degradation level when the setback amount L3 of the front side electrode is 15

μm and the window structure part length Lw is 15 μm. In FIG. 13, the horizontal axis represents the setback amount L4 of the rear side electrode, and the vertical axis represents the COD degradation level [W]. As shown in FIG. 13, it is found that the COD degradation level is hardly improved by increasing the setback amount L4 of the rear side electrode. This is because, since the end of the contact layer 107 is close to the window structure part 108, more current flows through the window structure part 108 even if the end of the rear side electrode 111 is kept apart from the laser end face.

As described above, when the resistance of the window structure part 108 is low, it is confirmed that improvement of the COD degradation level without deteriorating the characteristics of the semiconductor laser is difficult in both the method shown by the semiconductor laser 60 of the comparative example 2 in which the front side electrode 110 is kept apart from the laser end face and the method shown by the semiconductor laser 60 of the comparative example 3 in which the rear side electrode 111 is kept apart from the laser end face.

As shown in FIGS. 2 and 3, the semiconductor laser 50 of Embodiment 1 is different from the semiconductor laser 60 of the comparative examples 1 to 3 in that the COD degradation level can be improved without deteriorating the characteristics of the semiconductor laser. In the semiconductor laser 60 of the comparative example 2, in the case where only the position (referred to as front side current injection position) closest to the laser end face in the region where the front side electrode 110 is in contact with the contact layer 107 is kept apart from the laser end face, when the setback amount L3 of the front side electrode is increased up to the amount to improve the COD degradation level, an adverse effect is generated such that the optical power output is decreased as shown in FIGS. 10 and 11. In contrast, in the semiconductor laser 50 of Embodiment 1, when the setback amount L2 of the rear side electrode is made larger than 120 μm and the setback amount L1 of the front side electrode is larger than 15 μm as shown in FIGS. 2 and 3, the COD degradation level is improved and the satisfactory characteristics of the semiconductor laser can be maintained without significant reduction in the optical power output.

In the semiconductor laser 60 of the comparative example 3, even if only the rear side electrode 111 is kept apart from the laser end face, no COD improvement effect is observed as shown in FIG. 13. In contrast, in the semiconductor laser 50 of Embodiment 1, the rear side electrode 11 is kept apart from the laser end face, and the front side electrode 10 is kept apart from the laser end face, that is, the front side current injection position is kept apart from the laser end face, so that the COD improvement effect can be obtained while the satisfactory characteristics of the semiconductor laser is maintained without the significant reduction in optical power output.

The reason why the semiconductor laser 50 of Embodiment 1 can obtain the results shown in FIGS. 2 and 3 will be examined referring to FIGS. 4 and 5. FIG. 4 shows a current distribution in the vicinity of the front end face of the semiconductor laser 50 according to Embodiment 1, and FIG. 5 shows a current density at the positions of the active layer 4 in the semiconductor laser 50 according to Embodiment 1. In FIG. 5, the horizontal axis represents the position in the x direction, and the vertical axis represents the current density. An x-direction position x0 indicates the position of the front end face 14 in the x-direction, an x-direction position x1 indicates the position of the inner end apart from the front end face 14 of the window structure part 8 in the x-direction, an x-direction position x2 indicates the position in the x-direction of the inner end of the insulating film 9 apart from the front end face 14, and an x-direction position x3 indicates the position of the end of the rear side electrode 11 on the side of the front end face 14 in the x-direction. An x-direction position x7 indicates the position of the rear end face 15 in the x-direction, an x-direction position x6 indicates the position of the inner end apart from the rear end face 15 of the window structure part 8 in the x-direction, an x-direction position x5 indicates the position in the x-direction of the inner end of the insulating film 9 apart from the rear end face 15, and an x-direction position x4 indicates the position of the end of the rear side electrode 11 on the side of the front end face 15 in the x-direction.

Currents I1, I2, I3, and I4 flowing from the part where the front side electrode 10 is in contact with the contact layer 7 flow toward the rear side electrode 11, and tend to flow toward the center direction (center direction between x-direction position x3 and x-direction position x4) of the resonator as they approach the rear surface side electrode 11. Therefore, the current I1 flowing through the window structure part 8 is less than in the case where the rear side electrode 11 extends to the laser end face (refer to comparative example 2). In addition to the above, since the front side current injection position (x-direction position: x2, x5) is apart from the window structure part 8, the current flowing through the window structure part 8 can be further reduced. Note that, currents I1, I2, I3, and I4 shown in FIG. 4 are the currents at each of x-direction positions. Regarding I1, I2, I3, and I4, the current values have a relation of I2<I1<I3<I4, and the smallest current I2 is indicated by a thin arrow.

In the semiconductor laser 50 of Embodiment 1, since the front side current injection position and the end of the rear side electrode 11 together are apart from the laser end face, the setback amount L1 of the front side electrode at which the COD degradation level begins to improve can be significantly reduced, as compared with the case where only the front side current injection position is apart from the laser end face as in the comparative example 2. Specifically, in the comparative example 2, the setback amount L3 of the front side electrode at which the COD degradation level begins to improve is 100 μm, whereas in the semiconductor laser 50 of Embodiment 1, the COD degradation level begins to improve when the setback amount L1 of the front side electrode is between more than 15 μm and 25 μm. As a result, as shown in FIG. 5, in the current density characteristics 31 of the semiconductor laser 50 of Embodiment 1, the width of the region in which the current density decreases in the active layer region except for the window structure part 8, that is, the width of the region from the x-direction position x1 to the x-direction position x2 and the width of the region from the x-direction position x5 to the x-direction position x6 can be reduced. In the semiconductor laser 50 of Embodiment 1, since the width of the region in which the current density decreases is small in the active layer region except for the window structure part 8, unlike the semiconductor laser 60 of the comparative example 2, the adverse effect of the reduction of the optical power output can be reduced.

In the semiconductor laser 50 of Embodiment 1, the setback amount L1 of the front side electrode can be made smaller than that in the comparative example 2, and since the end of the rear side electrode 11 is apart from the laser end face, current flows toward the center direction of the resonator, so that current concentration in the vicinity of the front side current injection position is reduced. As a result, in the semiconductor laser 50 of Embodiment 1, heat generated locally at the window-structure-part active layer 4a is greatly reduced, and the internal degradation due to the heat generated locally is less likely to occur.

As for the setback amount L2 of the rear side electrode, for example, when the rear side electrode overlaps the cleavage position, in order to avoid a problem such as peeling of the rear side electrode in the cleaving process, the rear side electrode may be placed apart from the laser end face by several tens of microns. However, it can be seen from the result of FIG. 2 that the COD improvement effect cannot be obtained in the above case.

In the semiconductor laser 50 of Embodiment 1, an example is shown in which the window structure part length Lw is 15 μm and the setback amount L1 of the front side electrode is longer than the window structure length Lw by 10 μm or more in FIG. 1, but a preferable setback amount L1 of the front side electrode is described below. As can be seen from the experimental results and the description so far, in order to suppress the current flowing through the window structure part 8, it is preferable that the front side current injection position be located 10 μm or more apart from the end (x-direction position: x1, x6) of the window structure part 8. Namely, it is preferable that the setback amount L1 of the front side electrode be longer than the window structure part length Lw by 10 μm or more. Therefore, when the window structure part length Lw is 25 μm, the front side current injection position is preferably 35 μm or more from the end face is, the setback amount L1 of the front side electrode is preferably 35 μm or more.

Further, in the semiconductor laser 50 of Embodiment 1, it is shown that the setback amount L2 of the rear side electrode that determines the end position of the rear side electrode 11 is preferably 120 μm or more. However, when the substrate thickness of the n-type GaAs semiconductor substrate 1 is large, the lateral resistance (resistance in x-direction) in the semiconductor substrate 1 is small. Therefore, when the semiconductor substrate 1 of the n-type GaAs is thick, it is preferable that the setback amount L2 of the rear side electrode that determine the end position of the rear side electrode 11 be equal to or larger than a length given by a common ratio A between the setback amount L2 of the rear side electrode and the substrate thickness. When the substrate thickness is T, the ratio A is L2/T. In the semiconductor laser 50 of Embodiment 1, the substrate thickness of the semiconductor substrate 1 is 100 μm, and the setback amount L2 of the rear side electrode is preferably 120 μm or more, so that the ratio A is 1.2, namely, the setback amount L2 of the rear side electrode is preferably 1.2 times or more the substrate thickness T. For example, when the substrate thickness T is 120 μm, it is preferable that the setback amount L2 of the rear side electrode be 144 μm and the end (x-direction position x3) of the rear side electrode 11 be 144 μm or more apart from the laser end face (x-direction position x0).

Note that, an example of the semiconductor laser is shown in which the front side current injection position (x-direction position: x2, x5) is further apart from the laser end face side than the end (x-direction position: x1, x6) of the window structure part 8 on the both sides of the front end face 14 and the rear end face 15 in the laser end faces. In a typical semiconductor laser, since light is taken out only from the side of the front end face 14, it is general that the front end face 14 is coated with the coating film 12 with low reflectivity and the rear end face 15 is coated with the coating film 13 with high reflectivity, and in addition to the above, in some cases, light may be taken out from both end faces of the front end face 14 and the rear end face 15. Then, depending on the power output value etc. of the laser light of the semiconductor laser, only in one of the front end face 14 from which the laser light of the semiconductor laser is output and the rear end face 15 mainly reflecting the laser light, the front side current injection position (x-direction position x2 or x-direction position x5) may be further apart from the laser end face than the end (x-direction position x1 or x-direction position x6) of the window structure part 8. In a case in which the front side current injection position (x-direction position x2) is further apart from the laser end face than the end (x-direction position x1) of the window structure part 8 on the side of the front end face 14 of the laser end face, the COD tolerance of the front end face 14 of the laser end face can be improved while deterioration of the characteristics is suppressed. And in a case in which the front side current injection position (x-direction position x5) is further apart from the laser end face than the end (x-direction position x6) of the window structure part 8 on the side of the rear end face 15 of the laser end face, the COD tolerance of the rear end face 15 of the laser end face can be improved while deterioration of the characteristics is suppressed. The same evaluation results as those shown in FIGS. 2 and 3 can be obtained even when the front side current injection position (x-direction position x2 or x-direction position x5) is further apart from the laser end face than the end (x-direction position x1 or x-direction position x6) of the window structure part 8 only on one side of the front end face 14 and the rear end face 15 of the laser end faces.

In a semiconductor laser used for a communication laser in which an InGaAsP-base material is used, the semiconductor laser has a structure in which an epitaxial layer in a laser end face part is etched to remove a waveguide (active layer) in the laser end face part and an InP material or the like is buried (thereafter, referred to as semiconductor laser X). Such an end face structure is sometimes called a window structure, and in such a structure, the resistance of the InP buried part is larger than that of the other part. That is, the current value of the InP buried part is smaller than that of the other part. One example of the semiconductor laser disclosed in the present specification shows a method of solving the problems that occurs when the window structure part of the laser end face has a lower resistance than the other part, and in the structure such as the semiconductor laser X having no such feature, even if the front side electrode 10 and the rear side electrode 11 defined by the setback amount L1 of the front side electrode and the setback amount L2 of the rear side electrode are adopted, the effect of the one example of the semiconductor laser disclosed in the present specification cannot be enjoyed.

As described above, the semiconductor laser 50 of Embodiment 1 includes the semiconductor substrate 1, the active layer 4 formed on the front side of the semiconductor substrate 1 via the first cladding layer 2, the front side electrode 10 formed on the front side of the active layer 4 that is the opposite side to the side facing the semiconductor substrate 1, via the second cladding layer 6 and the contact layer 7, and the rear side electrode 11 formed on the rear side of the semiconductor substrate 1, and outputs laser light. The semiconductor laser 50 of Embodiment 1 is provided with the window structure part 8 including the low resistance active layer (window-structure-part active layer 4a) that is formed in the end face regions on the sides of the front end face 14 and the rear end face 15 between which the laser light travels back and forth and resonates, to have a lower resistance than the active layer 4 located inward with respect to the end face regions. The front end of the contact layer is defined as the end of the contact layer 7 on the side of the front end face 14, the rear end of the contact layer is defined as the end of the contact layer 7 on the side of the rear end face 15. The length (setback amount L1 of front side electrode) in the light round-trip direction in which the laser light travels back and forth between the front end of the contact layer on the side of the front end face 14 where the laser light is outputted and the front end face 14 is longer by 10 μm or more than the length of the front-end-face side window structure part (window structure part length Lw) that is the length in the light round-trip direction between the boundary of the window structure part 8 on the side of the front end face 14 and the front end face 14, and is shorter than the length between the front end face 14 and the rear end of the contact layer in the light round-trip direction. The length (setback amount L2 of rear side electrode) in the light round-trip direction between the end of the rear side electrode 11 on the side of the front end face 14 and the front end face 14 is 1.2 times or more the substrate thickness of the semiconductor substrate 1, and is shorter than the length in the light round-trip direction between the front end face 14 and the end of the rear side electrode 11 on the side of the rear end face 15. In the semiconductor laser 50 of Embodiment 1 and with the structure described above, since the length (setback amount L1 of front side electrode) between the front end of the contact layer and the front end face 14 in the light round-trip direction in which the laser light travels back and forth is longer than the length of the front-end-face side window structure part (window structure part length Lw) by 10 μm or more, and the length (setback amount L2 of rear side electrode) in the light round-trip direction between the end of the rear side electrode 11 on the side of the front end face 14 and the front end face 14 is 1.2 times or more the substrate thickness of the semiconductor substrate 1, the COD tolerance of the window structure part on the side of the front end face can be improved while deterioration of the characteristics is suppressed.

Further, the semiconductor laser 50 of Embodiment 1 includes the semiconductor substrate 1, the active layer 4 formed on the front side of the semiconductor substrate 1 via the first cladding layer 2, the front side electrode 10 formed on the front side of the active layer 4 that is the opposite side to the side facing the semiconductor substrate 1, via the second cladding layer 6 and the contact layer 7, and the rear side electrode 11 formed on the rear side of the semiconductor substrate 1, and outputs laser light. The semiconductor laser 50 of Embodiment 1 is provided with the window structure part 8 including the low resistance active layer (window-structure-part active layer 4a) that is formed in the end face regions on the sides of the front end face 14 and the rear end face 15 between which the laser light travels back and forth and resonates, to have a lower resistance than the active layer 4 located inward with respect to the end face regions. The front end of the contact layer is defined as the end of the contact layer 7 on the side of the front end face 14, the rear end of the contact layer is defined as the end of the contact layer 7 on the side of the rear end face 15. The length (setback amount L1 of front side electrode) in the light round-trip direction in which the laser light travels back and forth between the rear end of the contact layer on the side opposite to the front end face 14 where the laser light is outputted and the rear end face 15 is longer by 10 μm or more than the length of the rear-end-face side window structure part (window structure part length Lw) that is the length in the light round-trip direction between the boundary of the window structure part 8 on the side of the rear end face 15 and the rear end face 15, and is shorter than the length between the rear end face 15 and the front end of the contact layer in the light round-trip direction. The length (setback amount L2 of rear side electrode) in the light round-trip direction between the end of the rear side electrode 11 on the side of the rear end face 15 and the rear end face 15 is 1.2 times or more the substrate thickness of the semiconductor substrate 1 and is shorter than the length in the light round-trip direction between the rear end face 15 and the end of the rear side electrode 11 on the side of the front end face 14. In the semiconductor laser 50 of Embodiment 1 and with the structure described above, since the length (setback amount L1 of front side electrode) between the rear end of the contact layer and the rear end face 15 in the light round-trip direction in which the laser light travels back and forth is longer than the length of the rear-end-face side window structure part (window structure part length Lw) by 10 μm or more, and the length (setback amount L2 of rear side electrode) in the light round-trip direction between the end of the rear side electrode 11 on the side of the rear end face 15 and the rear end face 15 is 1.2 times or more the substrate thickness of the semiconductor substrate 1, the COD tolerance of the window structure part on the side of the front end face can be improved while deterioration of the characteristics is suppressed.

Embodiment 2

In Embodiment 1, an example is shown in which the front side current injection position (x-direction position: x2, x5) is further apart from the laser end face than the end (x-direction position: x1, x6) of the window structure part 8 on the both sides of the front end face 14 and the rear end face 15 in the laser end faces. In a typical semiconductor laser, since light is taken out only from the side of the front end face 14, it is general that the front end face 14 is coated with the coating film 12 with low reflectivity and the rear end face 15 is coated with the coating film 13 with high reflectivity. In this case, since COD degradation occurs first on the side of the front end face 14, the insulating film 9 formed such that the front side current injection position is further apart from the laser end face than the end (x-direction position x1) of the window structure part 8 is adopted only on the side of the front end face 14.

Figure 14:
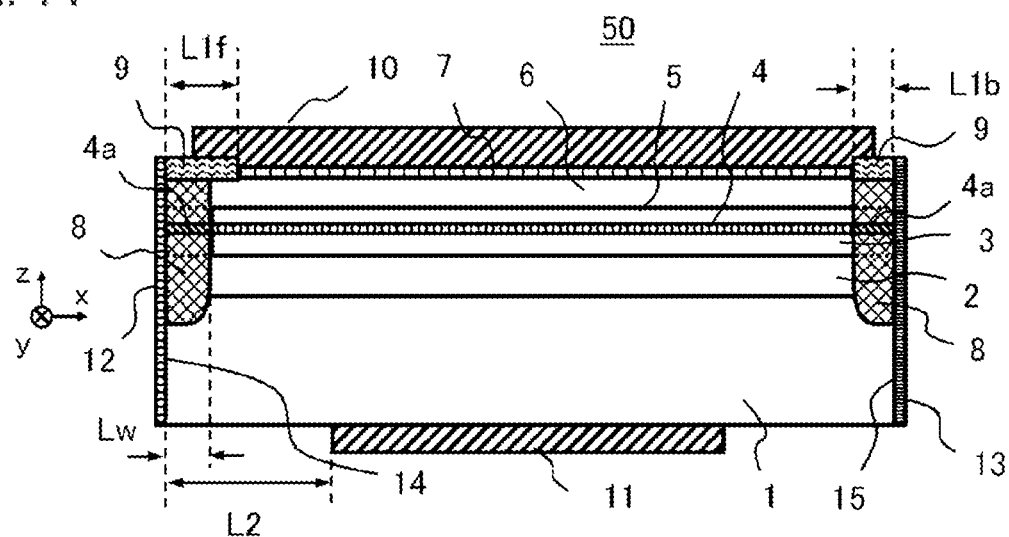
FIG. 14 shows a cross-sectional structure of a semiconductor laser according to Embodiment 2.

FIG. 14 shows a cross-sectional structure of a semiconductor laser according to Embodiment 2. The semiconductor laser 50 of Embodiment 2 differs from the semiconductor laser 50 of Embodiment 1 in that a setback amount L1f of the front side electrode on the side of the front end face 14 is longer than the window structure part length Lw and a setback amount L1b of the front side electrode on the side of the rear end face 15 is the same as the window structure part length Lw. The setback amount L1f of the front side electrode is the length from the front end face 14 of the laser end face to the inner end of the insulating film 9, and the setback amount L1b of the front side electrode is the length from the rear end face 15 of the laser end face to the inner end of the insulating film 9. As described in Embodiment 1, the setback amount L1f of the front side electrode is preferably 10 μm or more than the window structure part length Lw. As described in Embodiment 1, the setback amount L2 of the rear side electrode is preferably 1.2 times the substrate thickness T of the semiconductor substrate 1. In the semiconductor laser 50 of Embodiment 2, the setback amount L1f of the front side electrode on the side of the front end face 14 is longer than the window structure part length Lw by 10 μm or more, and the setback amount L2 of the rear side electrode at least on the side of the front end face 14 is 1.2 times or more the substrate thickness T of the semiconductor substrate 1, so that the COD tolerance can be improved while deterioration of the characteristics is suppressed. The semiconductor laser 50 of Embodiment 2 has the same structure from a center part to the side of the front end face 14 as that of the semiconductor laser 50 of Embodiment 1, so that the same effects as those of the semiconductor laser 50 of Embodiment 1 are achieved.

As described above, the semiconductor laser 50 of Embodiment 2 includes the semiconductor substrate 1, the active layer 4 formed on the front side of the semiconductor substrate 1 via the first cladding layer 2, the front side electrode 10 formed on the front side of the active layer 4 that is opposite side to the side facing the semiconductor substrate 1, via the second cladding layer 6 and the contact layer 7, and the rear side electrode 11 formed on the rear side of the semiconductor substrate 1, and outputs laser light. The semiconductor laser 50 of Embodiment 2 is provided with the window structure part 8 including the low resistance active layer (window-structure-part active layer 4a) that is formed in the end face regions on the sides of the front end face 14 and the rear end face 15 between which the laser light travels back and forth and resonates, to have a lower resistance than the active layer 4 located inward with respect to the end face regions. The front end of the contact layer is defined as the end of the contact layer 7 on the side of the front end face 14, the rear end of the contact layer is defined as the end of the contact layer 7 on the side of the rear end face 15. The length (setback amount L1 of front side electrode) in the light round-trip direction in which the laser light travels back and forth between the front end of the contact layer on the side of the front end face 14 where the laser light is outputted and the front end face 14 is longer by 10 μm or more than the length of the front-end-face side window structure part (window structure part length Lw) that is the length in the light round-trip direction between the boundary of the window structure part 8 on the side of the front end face 14 and the front end face 14, and is shorter than the length between the front end face 14 and the rear end of the contact layer in the light round-trip direction. The length (setback amount L1 of front side electrode) between the rear end of the contact layer and the rear end face 15 in the light round-trip direction is equal to or greater than the length of the rear-end-face side window structure part (window structure part length Lw) that is the length in the light round-trip direction between the boundary of the window structure part 8 on the side of the rear end surface 15 and the rear end face 15, and is shorter than the length between the rear end face 15 and the front end of the contact layer in the light round-trip direction. The length (setback amount L2 of rear side electrode) in the light round-trip direction between the end of the rear side electrode 11 on the side of the front end face 14 and the front end face 14 is 1.2 times or more the substrate thickness of the semiconductor substrate 1 and is shorter than the length in the light round-trip direction between the front end face 14 and the end of the rear side electrode 11 on the side of the rear end face 15. In the semiconductor laser 50 of Embodiment 2 and with the structure described above, since the length (setback amount L1 of front side electrode) between the front end of the contact layer and the front end face 14 in the light round-trip direction in which the laser light travels back and forth is longer than the length of the front-end-face side window structure part (window structure part length Lw) by 10 μm or more; the length (setback amount L1 of front side electrode) between the rear end of the contact layer and the rear end face 15 in the light round-trip direction is equal to or longer than the length of the rear-end-face side window structure part (window structure part length Lw); and the length (setback amount L2 of rear side electrode) in the light round-trip direction between the end of the rear side electrode 11 on the side of the front end face 14 and the front end face 14 is 1.2 times or more the substrate thickness of the semiconductor substrate 1, the COD tolerance can be improved while deterioration of the characteristics is suppressed.

Embodiment 3

Embodiments 1 and 2 show an example of a structure in which the semiconductor substrate 1 is the n-type semiconductor substrate, and the undoped first optical guide layer 3, the active layer 4, and the second optical guide layer 5 are sandwiched between the semiconductor substrate 1 and the semiconductor layer that is a p-type semiconductor layer and is on the opposite side to the semiconductor substrate 1. Alternatively, as the opposite case, the semiconductor substrate 1 may be a p-type semiconductor substrate and the undoped first optical guide layer 3, the active layer 4, and the second optical guide layer 5 are sandwiched between the semiconductor substrate 1 and the semiconductor layer that is a n-type semiconductor layer and is on the opposite side to the semiconductor substrate 1 In this case as well, it is possible to improve the COD tolerance of the window structure part at least on one side of the laser end faces while deterioration of the characteristics is suppressed.

Figure 15:
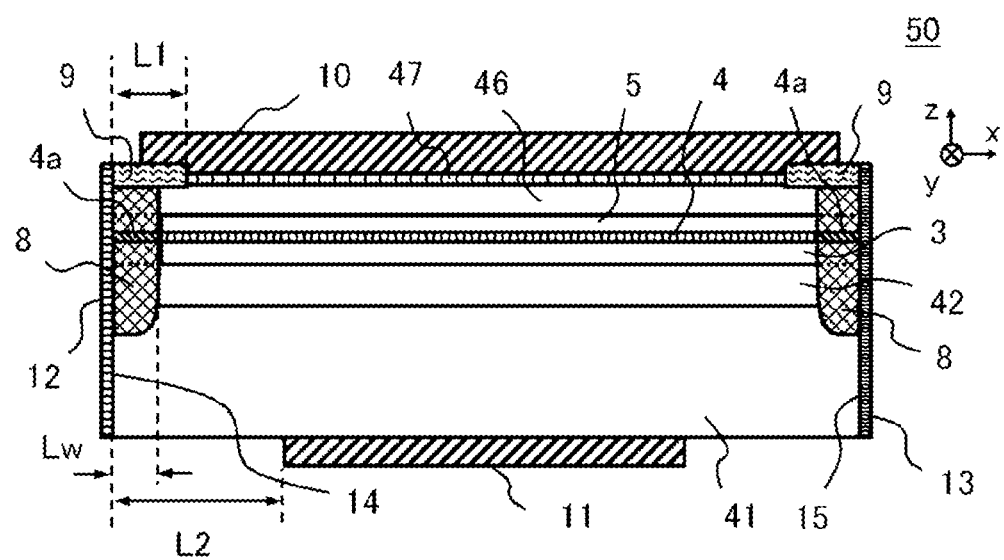
FIG. 15 shows a cross-sectional structure of a semiconductor laser according to Embodiment 3.

FIG. 15 shows a cross-sectional structure of a semiconductor laser according to Embodiment 3. The semiconductor laser 50 of Embodiment 3 differs from the semiconductor laser 50 of Embodiment 1 in that the conductivity type of the semiconductor materials sandwiching the undoped first optical guide layer 3, the active layer 4, and the second optical guide layer 5 are inverted. The semiconductor laser 50 of Embodiment 3 has a p-type GaAs semiconductor substrate 41, and a first cladding layer 42 made of p-type AlInP is formed on the surface of the semiconductor substrate 41 so as to be directly joined to the semiconductor substrate 41. The first optical guide layer 3 made of undoped AlInP is formed on the surface (surface opposite to the surface facing the semiconductor substrate 41) of the first cladding layer 42, and the active layer 4 made of undoped GaInP is formed on the surface of the first optical guide layer 3. A second optical guide layer 5 made of undoped AlGaInP is formed on the surface of the active layer 4. A second cladding layer 46 made of n-type AlInP is formed on the surface of the second optical guide layer 5, and a contact layer 47 made of n-type GaAs is formed on the surface of the second cladding layer 46. The first cladding layer 42, the first optical guide layer 3, the second optical guide layer 5, and the second cladding layer 46 are made of an AlGaInP-based material.

The thickness (substrate thickness) of the semiconductor substrate 41 is, for example, 100 μm. The first cladding layer 42 has a thickness of about 1.0 μm and its carrier concentration of about $1.0 \times 10^{18}$ $cm^{-3}$. The thickness of the first optical guide layer 3 and the second optical guide layer 5 is about 0.1 μm, and the thickness of the active layer 4 is about 8-20 nm. The second cladding layer 46 has a thickness of about 1.0 μm and its carrier concentration of about $1.0 \times 10^{18}$ $cm^{-3}$. The contact layer 47 has a thickness of about 0.02 μm and its carrier concentration of about $1.0\text{-}2.0 \times 10^{19}$ $cm^{-3}$. The other configuration is the same as that of the semiconductor laser 50 of Embodiment 1.

The semiconductor laser 50 of Embodiment 3 has the same structure as the semiconductor laser 50 of Embodiment 1 except for the difference in the conductivity type of the semiconductor material, and thus the same effects as those of the semiconductor laser 50 of Embodiment 1 are achieved. In addition, FIG. 15 shows an example of the same structure as the semiconductor laser 50 of Embodiment 1. Note that, in the structure of the semiconductor laser 50 of Embodiment 2 shown in FIG. 14, the conductivity type of the semiconductor material may be inverted.

Embodiment 4

Figure 16:
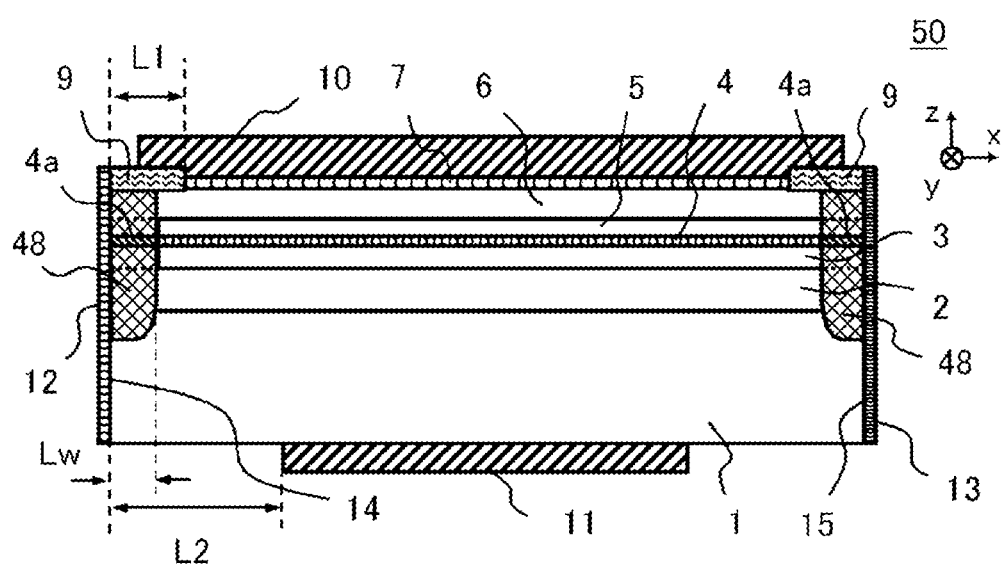
FIG. 16 shows a cross-sectional structure of a semiconductor laser according to Embodiment 4.

In Embodiments 1 to 3, an example of the window structure part 8 using the diffusion of Zn is shown. Since the window structure part 8 using the diffusion of Zn has a lower resistance than the part located inward with respect to the window structure part 8, the window structure part 8 is not limited to the window structure part using the diffusion of Zn as long as the resistance is low. FIG. 16 shows a cross-sectional structure of a semiconductor laser according to Embodiment 4. The semiconductor laser 50 of Embodiment 4 is different from the semiconductor laser 50 of Embodiment 1 in that a window structure part 48 has a lower resistance than a region except for the window structure part by using Si implantation or the like. In the window structure part forming process of forming the window structure part 48, Si ions or the like are implanted from the side of the contact layer 7. In the case of ion implantation of Si ions or the like, the ion implantation is performed after an insulating film such as $SiO_2$ or SiN having an opening in a region for the implantation is formed. Although it is not necessary to remove the contact layer 7 on the region where the window structure part 48 is to be formed when the ion implantation is performed, the contact layer 7 on the region where the window structure part 48 is formed is removed before the front side electrode 10 is formed. The window-structure-part active layer 4a of the window structure part 48 is a low resistance active layer containing Si and having a resistance lower than that of the active layer 4 located inward with respect to the end face regions on the sides of the front end face 14 and the rear end face 15.

The semiconductor laser 50 of Embodiment 4 has the same structure as that of the semiconductor laser 50 of Embodiment 1 except that the impurity in the window structure part 48 with low resistance is different, and thus the same effects as those of the semiconductor laser 50 of Embodiment 1 are achieved. In addition, FIG. 16 shows an example of the same structure as the semiconductor laser 50 of Embodiment 1. Note that, the window structure 48 with low resistance is also applicable to the structure of the semiconductor laser 50 in Embodiments 2 and 3.

The semiconductor laser 50 of Embodiments 1 to 4 may be made of the semiconductor materials shown in the comparative examples. In the semiconductor laser 50 of Embodiment 3 using the semiconductor materials shown in the comparative examples, the conductivity type of the semiconductor materials sandwiching the active layer of undoped GaInP is inverted. In the semiconductor laser 50 of Embodiments 1 to 4 using the semiconductor materials shown in the comparative examples, at least on one side of the front end face 14 and the rear end face 15, the setback amount L1 of the front side electrode is longer than the window structure part length Lw by 10 μm or more, and the setback amount L2 of the rear side electrode is 1.2 times or more the substrate thickness T of the semiconductor substrate 1, so that the COD tolerance of the window structure part on at least one side of the laser end faces can be improved while deterioration of the characteristics is suppressed.

Note that, in Embodiments 1 to 4, although the examples are described in which the window structure part length Lw on the side of the front end face 14 and on the side of the rear end face 15 is the same, the window structure part length Lw on the side of the front end face 14 may be different from that on the side of the rear end face 15. Although the examples are described which the setback amount L2 of the rear side electrode on the side of the front end face 14 and on the side of the rear end face 15 is the same, the setback amount L2 of the rear side electrode on the side of the front end surface 14 side may be different from that on the side of the rear end face 15. Further, in Embodiments 1, 3, and 4, the examples are described in which the setback amount L1 of the front side electrode on the side of the front end face 14 and on the side of the rear end face 15 is the same, but the setback amount L1 of the front side electrode on the side of the front end face 14 may be different from that on the side of the rear end face 15.

Although various exemplary embodiments and examples are described in the present application, various features, aspects, and functions described in one or more embodiments are not inherent in a particular embodiment, and can be applicable alone or in their various combinations to each embodiment. Accordingly, countless variations that are not illustrated are envisaged within the scope of the art disclosed in the specification of the present application. For example, the case where at least one component is modified, added or omitted, and the case where at least one component is extracted and combined with a component in another embodiment are included.

DESCRIPTION OF REFERENCE NUMERALS AND SIGNS

1: semiconductor substrate, 2: first cladding layer, 4: active layer, 4a: window-structure-part active layer (low resistance active layer), 6: second cladding layer, 7: contact layer, 8: window structure part, 10: front side electrode, 11: rear side electrode, 12: coating film, 13: coating film, 14: front end face, 15: rear end face, 50: semiconductor laser, L1, L1f, L1b: setback amount of front side electrode. L2: setback amount of rear side electrode, Lw: window structure part length

The invention claimed is:
1. A semiconductor laser for outputting laser light, comprising:
a semiconductor substrate;
an active layer formed on a front side of the semiconductor substrate via a first cladding layer;
a front side electrode formed on a front side of the active layer that is an opposite side to a side facing the semiconductor substrate, via a second cladding layer and a contact layer;
a rear side electrode formed on a rear side of the semiconductor substrate; and
a window structure part including a low resistance active layer that is formed in end face regions on sides of a front end face and a rear end face between which the laser light travels back and forth and resonates, to have a lower resistance than the active layer located inward with respect to the end face regions, wherein
a front end of the contact layer is defined as an end of the contact layer on the side of the front end face;

a rear end of the contact layer is defined as an end of the contact layer on the side of the rear end face;

a length in a light round-trip direction in which the laser light travels back and forth between the front end of the contact layer on the side of the front end face where the laser light is outputted and the front end face is longer by 10 µm or more than a length of a front-end-face side window structure part that is a length in the light round-trip direction between a boundary of the window structure part on the side of the front end face and the front end face, and is shorter than a length in the light round-trip direction between the front end face and the rear end of the contact layer; and a length in the light round-trip direction between an end of the rear side electrode on the side of the front end face and the front end face is 1.2 times or more a substrate thickness of the semiconductor substrate, and is shorter than a length in the light round-trip direction between the front end face and an end of the rear side electrode on the side of the rear end face.

2. The semiconductor laser according to claim 1, wherein a length in the light round-trip direction between the rear end of the contact layer and the rear end face is equal to or longer than a length of a rear-end-face side window structure part that is a length in the light round-trip direction between a boundary of the window structure part on the side of the rear end face and the rear end face, and is shorter than a length in the light round-trip direction between the rear end face and the front end of the contact layer; and a length in the light round-trip direction between the end of the rear side electrode on the side of the rear end face and the rear end face is 1.2 times or more the substrate thickness of the semiconductor substrate, and is shorter than a length in the light round-trip direction between the rear end face and the end of the rear side electrode on the side of the front end face.

3. The semiconductor laser according to claim 2, wherein the length in the light round-trip direction between the rear end of the contact layer and the rear end face is longer by 10 µm or more than the length of the rear-end-face side window structure part that is the length in the light round-trip direction between the boundary of the window structure part on the side of the rear end face and the rear end face, and is shorter than the length in the light round-trip direction between the rear end face and the front end of the contact layer.

4. The semiconductor laser according to claim 2, wherein a coating film for covering the window structure part is formed on the front end face and the rear end face, the coating film on the side of the front end face having lower reflectivity than that on the side of the rear end face.

5. The semiconductor laser according to claim 2, wherein the window structure part contains Zn.

6. The semiconductor laser according to claim 2, wherein the window structure part contains Si.

7. The semiconductor laser according to claim 1, wherein a coating film for covering the window structure part is formed on the front end face and the rear end face, the coating film on the side of the front end face having lower reflectivity than that on the side of the rear end face.

8. The semiconductor laser according to claim 1, wherein the window structure part contains Zn.

9. The semiconductor laser according to claim 1, wherein the window structure part contains Si.

10. The semiconductor laser according to claim 1, wherein the first cladding layer and the second cladding layer are made of an AlGaInP-based material.

11. The semiconductor laser according to claim 1, wherein the semiconductor substrate and the first cladding layer have n-type conductivity and the second cladding layer and the contact layer have p-type conductivity.

12. The semiconductor laser according to claim 1, wherein the semiconductor substrate and the first cladding layer have p-type conductivity and the second cladding layer and the contact layer have n-type conductivity.

13. A semiconductor laser for outputting laser light, comprising:

a semiconductor substrate;

an active layer formed on a front side of the semiconductor substrate via a first cladding layer;

a front side electrode formed on a front side of the active layer that is an opposite side to a side facing the semiconductor substrate via a second cladding layer and a contact layer;

a rear side electrode formed on a rear side of the semiconductor substrate; and a window structure part including a low resistance active layer that is formed in end face regions on sides of a front end face and a rear end face between which the laser light travels back and forth and resonates, to have a lower resistance than the active layer located inward with respect to the end face regions, wherein a front end of the contact layer is defined as an end of the contact layer on the side of the front end face;

a rear end of the contact layer is defined as an end of the contact layer on the side of the rear end face;

a length in a light round-trip direction in which the laser light travels back and forth between the rear end of the contact layer on an opposite side to the side of the front end face where the laser light is outputted and the rear end face is longer by 10 µm or more than a length of a rear-end-face side window structure part that is a length in the light round-trip direction between a boundary of the window structure part on the side of the rear end face and the rear end face, and is shorter than a length in the light round-trip direction between the rear end face and the front end of the contact layer; and a length in the light round-trip direction between an end of the rear side electrode on the side of the rear end face and the rear end face is 1.2 times or more a substrate thickness of the semiconductor substrate, and is shorter than a length in the light round-trip direction between the rear end face and an end of the rear side electrode on the side of the front end face.

14. The semiconductor laser according to claim 13, wherein a coating film for covering the window structure part is formed on the front end face and the rear end face, the coating film on the side of the front end face having lower reflectivity than that on the side of the rear end face.

15. The semiconductor laser according to claim 13, wherein the window structure part contains Zn.

16. The semiconductor laser according to claim 13, wherein the window structure part contains Si.

17. The semiconductor laser according to claim 13, wherein the first cladding layer and the second cladding layer are made of an AlGaInP-based material.

18. The semiconductor laser according to claim 13, wherein the semiconductor substrate and the first cladding layer have n-type conductivity and the second cladding layer and the contact layer have p-type conductivity.

19. The semiconductor laser according to claim 13, wherein the semiconductor substrate and the first cladding layer have p-type conductivity and the second cladding layer and the contact layer have n-type conductivity.

* * * * *